United States Patent
Konishi

(10) Patent No.: US 7,453,727 B2
(45) Date of Patent: Nov. 18, 2008

(54) NONVOLATILE SEMICONDUCTOR MEMORY AND METHOD FOR SETTING REPLACEMENT INFORMATION IN NONVOLATILE SEMICONDUCTOR MEMORY

(75) Inventor: Shinya Konishi, Kanagawa (JP)

(73) Assignee: NEC Electronics Corporation, Kawasaki, Kanagawa (JP)

(*) Notice: Subject to any disclaimer, the term of this patent is extended or adjusted under 35 U.S.C. 154(b) by 68 days.

(21) Appl. No.: 11/179,680

(22) Filed: Jul. 13, 2005

(65) Prior Publication Data
US 2006/0023524 A1 Feb. 2, 2006

(30) Foreign Application Priority Data
Jul. 14, 2004 (JP) .............................. 2004-207781

(51) Int. Cl.
  *G11C 16/06* (2006.01)
(52) U.S. Cl. .............................. 365/185.09; 365/185.03; 365/185.11; 365/185.21
(58) Field of Classification Search ............ 365/185.03, 365/185.09, 185.11, 185.21
See application file for complete search history.

(56) References Cited

U.S. PATENT DOCUMENTS

| | | | |
|---|---|---|---|
| 6,141,267 A * | 10/2000 | Kirihata et al. ............. | 365/200 |
| 6,188,618 B1 * | 2/2001 | Takase ........................ | 365/200 |
| 6,404,683 B1 * | 6/2002 | Yumoto ....................... | 365/200 |
| 6,728,133 B2 * | 4/2004 | Shimizu ................. | 365/185.03 |
| 6,985,383 B2 * | 1/2006 | Tang et al. .................. | 365/171 |
| 2004/0037112 A1 * | 2/2004 | Ooishi .................... | 365/185.09 |

FOREIGN PATENT DOCUMENTS

| | | |
|---|---|---|
| JP | 2537264 | 7/1996 |
| JP | 2002-237191 | 8/2002 |

* cited by examiner

*Primary Examiner*—Huan Hoang
(74) *Attorney, Agent, or Firm*—McGinn IP Law Group, PLLC

(57) ABSTRACT

A nonvolatile semiconductor memory includes a memory cell array and a replacement data cell array. The memory cell array includes a plurality of main cell arrays and a plurality of redundancy cell arrays. The replacement data cell array stores a replacement data indicating a replacement of one main cell array by one redundancy cell array. The replacement data cell array includes a plurality of first storage sections and a plurality of second storage sections. The first storage section corresponds to one redundancy cell array and stores a replacement confirmation data indicating whether or not the corresponding one redundancy cell array replaces one main cell array, by nonvolatile memory cells of two bits. The second storage section corresponds to one redundancy cell array and stores an address data indicating an address for one main cell array which is replaced by the corresponding one redundancy cell array.

20 Claims, 9 Drawing Sheets

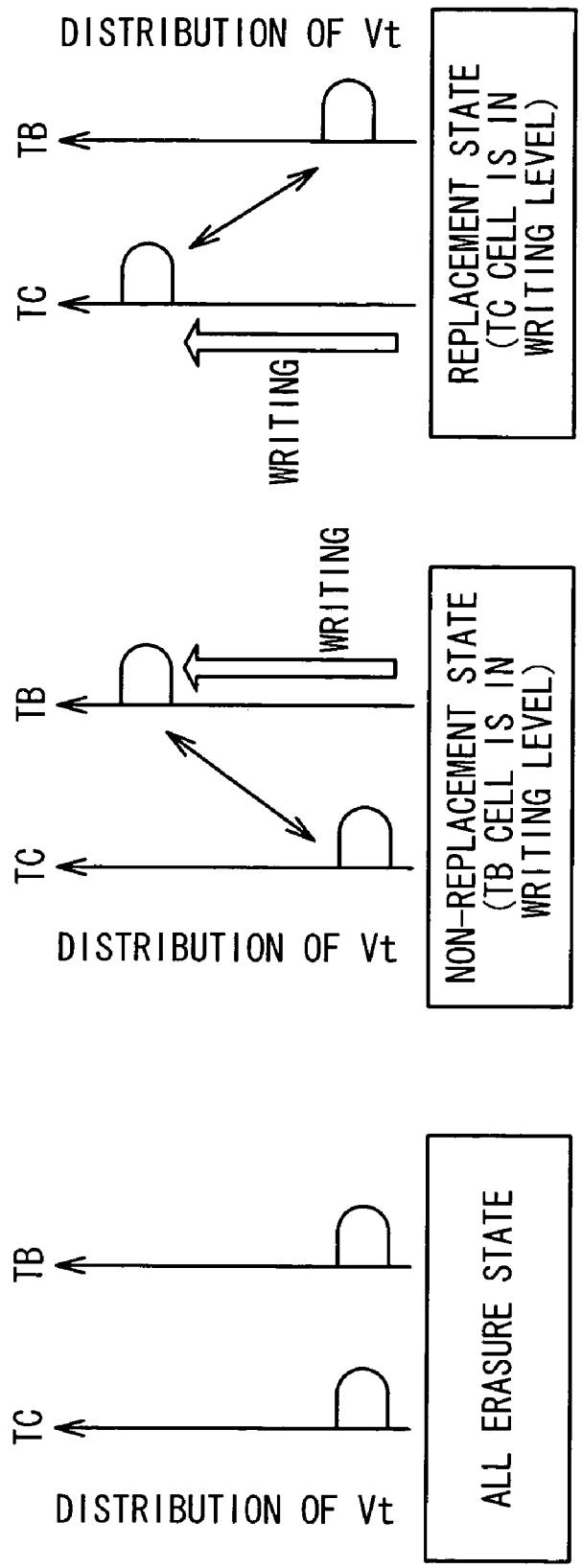

NONVOLATILE SEMICONDUCTOR MEMORY AND METHOD FOR SETTING REPLACEMENT INFORMATION IN NONVOLATILE SEMICONDUCTOR MEMORY

BACKGROUND OF THE INVENTION

1. Field of the Invention

The present invention relates to a nonvolatile semiconductor memory and a method for setting replacement information in a nonvolatile semiconductor memory. More specifically, the present invention relates to a nonvolatile semiconductor memory and a method for setting replacement information in the nonvolatile semiconductor memory, in which a method for storing replacement data is improved.

2. Description of the Related Art

There has been known a nonvolatile semiconductor memory that includes a plurality of main cell arrays, a plurality of redundant cell arrays, and a replacement data storage unit. Each of the redundant memory cell arrays replaces a defect one of the main cell arrays. The replacement data storage unit stores the replacement data indicating which of the main cell arrays is replaced by which of the redundant cell arrays.

Whenever the nonvolatile semiconductor memory is accessed in a write operation, a read operation or the like, the replacement data stored in the replacement data storage unit is referred to. Each of the operations is executed based on the referring result. It is, therefore, necessary to promptly and accurately access the replacement data. A technique that enables promptly and accurately accessing the replacement data is desired.

Meanwhile, the replacement data stored in the replacement data storage unit is stored when the nonvolatile semiconductor memory is manufactured. Since it is preferable that time required to manufacture it is as short as possible, it is desired to store the replacement data within time as short as possible. Besides, it is required to accurately store the replacement data.

In conjunction with the above description, Japanese Patent JP 2537264B discloses a semiconductor memory apparatus. This semiconductor memory apparatus includes a memory cell array, a write circuit, a differential amplification type sense amplifier, a latch circuit, and setting means. The memory cell array includes many memory cells with two writable nonvolatile memory cells selected by the same word line selection signal and the same column selection signal as one bit. The write circuit writes complementary bit data to the two memory cells through a pair of bit lines to which the corresponding pair memory cells are connected, respectively. The differential amplification type sense amplifier amplifiers a potential difference between the paired bit lines and judges read data. The latch circuit temporarily latches a content of write data input in a write operation. The setting means sets a data judgment criterion during verification right after data is written to be stricter than a judgment criterion during a normal read operation based on latch data stored in the latch circuit.

Japanese Laid Open Patent Application JP 2002-237191A discloses a complementary nonvolatile memory circuit. This nonvolatile memory circuit is a nonvolatile memory circuit using FLOTOX (floating gate tunnel oxide) type electrically writable nonvolatile storage elements. The nonvolatile memory circuit includes a first data line and a second data line. A drain of a first nonvolatile storage element is connected to the first data line through at least one first selected transistor. A drain of a second nonvolatile storage element is connected to the second data line through at least one second selected transistor. A gate of the first nonvolatile storage element is connected to a drain of a second nonvolatile storage element. A gate of the second nonvolatile storage element is connected to a drain of the first nonvolatile storage element. The first data line is connected to a first current load circuit and a first input terminal of a sense amplifier circuit. The second data line is connected to a second current load circuit and a second input terminal of the sense amplifier circuit. Sources of the first nonvolatile storage element and the second nonvolatile storage elements are connected to a ground potential through switching transistors, respectively. This nonvolatile memory circuit is characterized by always storing complementary pairs of positive and negative logic states of one-bit data using the first and second nonvolatile storage elements.

SUMMARY OF THE INVENTION

In order to achieve an aspect of the present invention, the present invention provides a nonvolatile semiconductor memory including: a memory cell array which includes a plurality of main cell arrays and a plurality of redundancy cell arrays; and a replacement data cell array which stores a replacement data indicating a replacement of one of the plurality of main cell arrays by one of the plurality of redundancy cell arrays, wherein the replacement data cell array includes:

a plurality of first storage sections, each of which corresponds to one of the plurality of redundancy cell arrays and stores a replacement confirmation data indicating whether or not the corresponding one of the plurality of redundancy cell arrays replaces one of the plurality of main cell arrays, by nonvolatile memory cells of two bits, and a plurality of second storage sections, each of which corresponds to one of the plurality of redundancy cell arrays and stores an address data indicating an address for one of the plurality of main cell arrays which is replaced by the corresponding one of the plurality of redundancy cell arrays.

According to the present invention, nonvolatile memory cells of two bits are used for one-bit replacement data, and complementary data is allocated to the nonvolatile memory cells of two bits, respectively. In the read operation, one sense amplifier complementarily reads data from the nonvolatile memory cells of two bits to which the respective complementary data is allocated. Namely, the replacement data can be promptly and accurately read when a reading section such as a sense amplifier read the replacement data.

According to the present invention, it is possible to promptly and accurately access replacement data. In addition, it is possible to accurately execute storage of the replacement data in shorter time.

BRIEF DESCRIPTION OF THE DRAWINGS

The above and other objects, advantages and features of the present invention will be more apparent from the following description taken in conjunction with the accompanying drawings, in which:

FIGS. 9A to 9C shows threshold voltage states in a first nonvolatile memory cell and a second nonvolatile memory cell.

DESCRIPTION OF THE PREFERRED EMBODIMENTS

Embodiments of a nonvolatile semiconductor memory and a method for setting replacement information in a nonvolatile semiconductor memory according to the present invention will be described with reference to the attached drawings.

First Embodiment

A nonvolatile semiconductor memory and a method for setting replacement information in the nonvolatile semiconductor memory according to the first embodiment of the present invention will described with reference to the attached drawings. A configuration of the nonvolatile semiconductor memory according to the first embodiment will first be described below.

Figure 1:
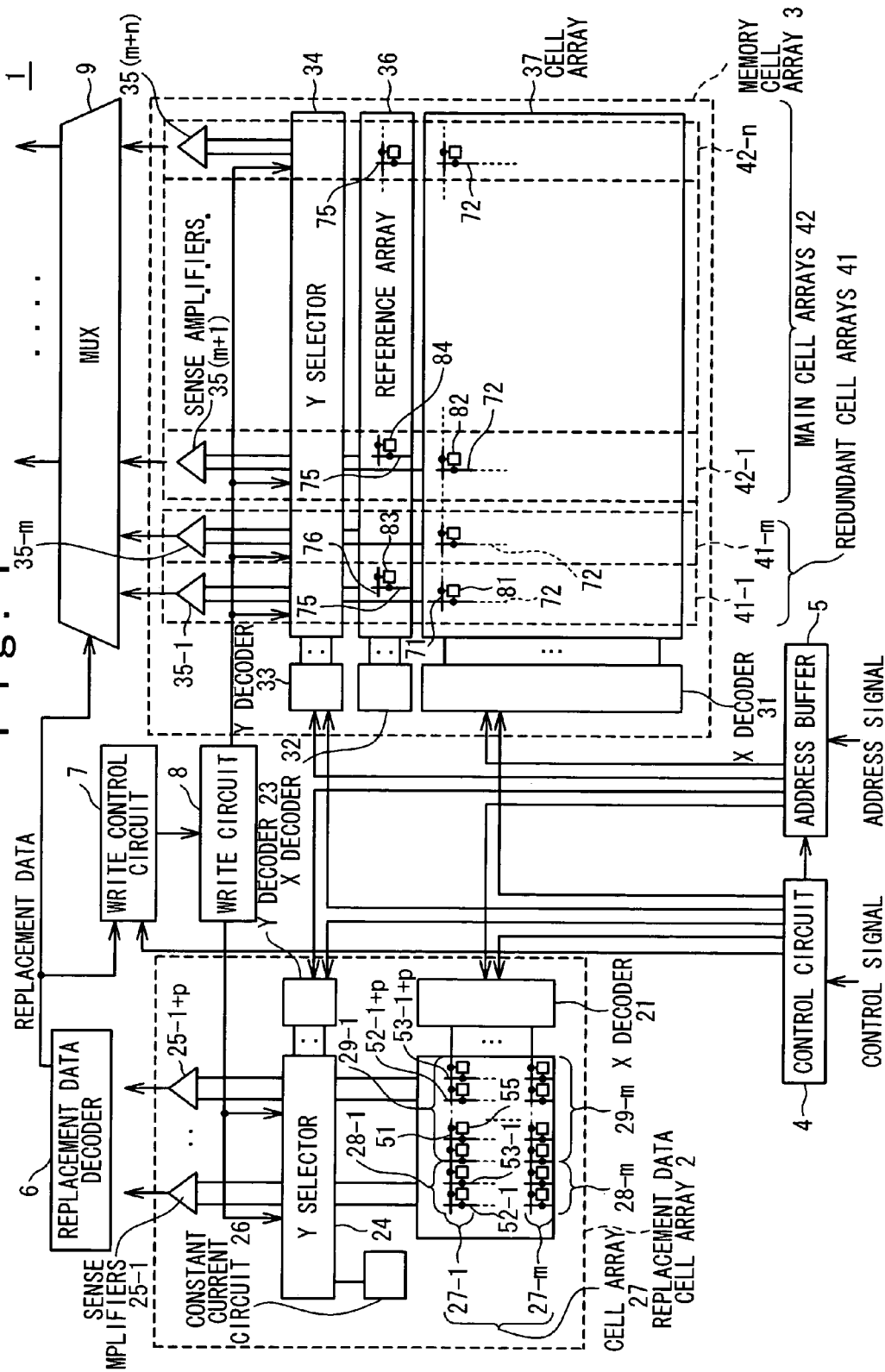
FIG. 1 is a block diagram showing a configuration of a nonvolatile semiconductor memory according to a first embodiment of the present invention.

FIG. 1 is a block diagram showing the configuration of the nonvolatile semiconductor memory according to the first embodiment of the present invention. In FIG. 1, a configuration related to data erasure is not shown. A nonvolatile semiconductor memory 1 includes a replacement data cell array 2, a memory cell array 3, a control circuit 4, an address buffer 5, a replacement data decoder 6, a write control circuit 7, a write circuit 8, and a multiplexer 9.

The control circuit 4 outputs a control signal to each of the address buffer 5, the replacement data cell array 2 (an X decoder 21 and a Y decoder 23), the memory cell array 3 (an X decoder 31 and a Y decoder 33), the write control circuit 7, and the multiplexer 9, based on a received control signal.

The address buffer 5 outputs an address signal to each of the replacement data cell array 2 (X decoder 21 and Y decoder 23) and the memory cell array 3 (X decoder 31 and Y decoder 33) based on a received address signal and the control signal from the control circuit 4.

The memory cell array 3 includes a plurality of nonvolatile memory cells each of which stores data. The memory cell array 3 includes the X decoder 31, an X decoder 32, the Y decoder 33, a Y selector 34, a sense amplifier 35, a reference array 36, and a cell array 37.

The cell array 37 includes a plurality of word lines 71, a plurality of bit lines 72, a plurality of nonvolatile memory cells 81, and a plurality of nonvolatile memory cells 82. The word line 71 extends in an X direction. The bit line 72 extends in a Y direction. The nonvolatile memory cells 81 (for redundant cell arrays 41) and the nonvolatile memory cells 82 (for main cell arrays 42) are provided in a matrix at intersections between a plurality of word lines 71 and bit lines 72, respectively.

The X decoder 31 is connected to a plurality of word lines 71. The X decoder 31 selects at least one selection word line 71 from the plurality of word lines 71 based on outputs from the control circuit 4 and the address buffer 5.

The Y decoder 33 outputs a signal for selecting at least one selection bit line 72 from a plurality of bit lines 72 based on the outputs from the control circuit 4 and the address buffer 5. In a read operation, the Y decoder 33 outputs a signal for selecting a plurality of reference cell bit lines 75, to the Y selector 34.

The Y selector 34 is connected to the plurality of bit lines 72 and the plurality of reference cell bit lines 75. The reference cell bit lines 75 are connected to reference cells in the reference cell array 36, respectively. The Y selector 34 selects at least one selection bit line 72 from the plurality of bit lines 72 based on the signal from the Y decoder 33. At the same time, the Y selector 34 selects one reference cell bit line 75 that forms a pair with the selection bit line 72, as a selection reference cell bit line 75 based on the signal from the Y decoder 33.

The X decoder 32 is connected to a plurality of reference cell word lines 76. In the read operation, the X decoder 32 selects the selection reference cell word line 76, for selecting reference cells (83 and 84) connected to the selection reference cell bit line 75, from the plurality of reference cell word lines 76 based on the signal from the Y decoder 33.

The reference array 36 includes the plurality of reference cell word lines 76, the plurality of reference cell bit lines 75, a plurality of reference cells 83, and a plurality of reference cells 84. The reference cells are nonvolatile memory cells. The reference cell word line 76 extends in the X direction. The reference cell bit line 75 extends in the Y direction. The reference cells 83 (for the redundant cell arrays 41) and the reference cells 84 (for the main cell arrays 42) are provided at intersections between the plurality of reference cell bit lines 75 and the plurality of reference cell word lines 76, respectively.

Each sense amplifier 35 is connected to the selection bit line 72 and the selection reference cell bit line 75 selected by the Y selector 34. In response to signals received from the selection bit line 72 and the selection reference cell bit line 75, the sense amplifier 35 outputs a signal indicating one of the received signals which satisfies predetermined conditions.

A group of a predetermined number of cell arrays 37, a predetermined number of reference arrays 36, and a predetermined number of sense amplifiers 35 is also referred to as the redundant cell array 41 or the main cell array 42. In this embodiment, the nonvolatile memory 1 includes a plurality of (m) redundant cell arrays 41 and a plurality of (n, where n>m) main cell arrays 42.

The replacement data cell array 2 includes a plurality of nonvolatile memory cells 55 each of which stores replacement data regarding a replacement of one main cell array 42 by one redundant cell array 41. The redundant data cell array 2 includes the X decoder 21, the Y decoder 23, a Y selector 24, a sense amplifier 25, a constant-current circuit 26, and a cell array 27.

Each cell array 27 includes a plurality of word lines 51, a plurality of first bit lines 52, a plurality of second bit line 53, a plurality of first nonvolatile memory cells TC, and a plurality of second nonvolatile memory cells TB. The word line 51 (51-1 to 51-m) extends in the X direction. The first bit line 52

(52-1 to 52-(1+p)) and the second bit line 53 (53-1 to 53-(1+p)) extend in the Y direction and form pairs, respectively. The first nonvolatile memory cells TC are provided at intersections between the first bit lines 52 and a plurality of word lines 53, respectively. The second nonvolatile memory cells TB are provided in a matrix at intersections between the plurality of second bit lines 53 and the plurality of word lines 51, respectively.

A pair of the first nonvolatile memory cell TC and the second nonvolatile memory cell TB corresponding to a pair of the first bit line 52 and the second bit line 53 store one data (of two bits). Namely, based on a relative difference between the data stored in the first and second nonvolatile memory cells TC and TB (a difference in threshold voltage Vt due to stored charges), pieces of data are stored in the first nonvolatile memory cell TC and the second nonvolatile memory cell TB complementarily. For example, the first nonvolatile memory cell TC and the second nonvolatile memory cell TB store address data "1" indicating addresses of the main cell array to be replaced, when (a threshold voltage Vt1 of the first nonvolatile memory cell TC)>(a threshold voltage Vt2 of the second nonvolatile memory cell TB) is satisfied. The first nonvolatile memory cell TC and the second nonvolatile memory cell TB store address data "0" indicating addresses of the main cell array to be replaced when Vt1<Vt2 is satisfied. To store data complementarily is preferable since accuracy and read rate of data can be improved. The pair of the first nonvolatile memory cell TC and the second nonvolatile memory cell TB is also referred to as a complementary cell.

The redundant cell array 41 corresponding to each cell array 27 is determined according to addresses (e.g., rows) of the cell array 27. Namely, rows 27-1 to 27-m of the cell array 27 correspond to redundant cell arrays 41-1 to 41-m, respectively. One (e.g., the first) complementary cell 28 in a certain row 27 stores replacement confirmation data indicating whether the corresponding redundant cell array 41 replaces the main cell array 42. The other complementary cells 29 (e.g., second to (1+p)-th, where p indicates the number of bits of an address) in the same row 27 store address data indicating an address of the memory cell array 42 replaced by the corresponding redundant cell array 41. For example, the first complementary cell 28-1 in the first row 27-1 stores replacement confirmation data on the redundant cell array 41-1. The other complementary cell 29-1, including the second to (1+p)-th complementary cells, in the first row 27-1 stores the address data indicating address of the main cell arrays 42 replaced by the redundant cell array 41-1.

The X decoder 21 is connected to a plurality of word lines 51. The X decoder 21 selects at least one selection word line 51 from the word lines 51 based on outputs from the control circuit 4 and the address buffer 5. The Y decoder 23 outputs a signal for selecting at least one selection first bit line 52 from the first bit lines 52 and selecting at least one selection second bit line 53 from the second bit line 53 to the Y selector 24 based on the outputs from the control circuit 4 and the address buffer 5. The Y selector 24 is connected to the plurality of first bit lines 52 and the plurality of second bit lines 53. The Y selector 24 selects at least one selection first bit line 52 from a plurality of the first bit lines 52 and selects at least one selection second bit line 53 from the second bit lines 53 based on the signal from the Y decoder 23. The sense amplifiers 25 (25-1 to 25-(1+p)) are connected to the first bit line 52 and the second bit line 53 selected by the Y selector 24. In response to signals received from the selection bit line 52 and the selection reference cell bit line 53, each of the sense amplifiers 25 (25-1 to 25-(1+p)) outputs a signal indicating one of the received signals which satisfies predetermined conditions.

The constant-current circuit 26 supplies a constant current to a selection first bit line or a selection second bit line selected by the Y selector 24 based on the signal from the control circuit 4. The constant-current circuit 26 is not limited to a specific type. For example, a reference cell (nonvolatile memory cell) having a threshold voltage set to a predetermined voltage (an intermediate level) may be used as the constant-current circuit 26. In this case, during usage, a predetermined voltage is applied to a control gate. Alternatively, a current-mirror circuit may be used as the constant-current circuit 26.

The replacement data decoder 6 outputs replacement data to the write control circuit 7 (in a write operation) or the multiplexer 9 (in a read operation) based on outputs from the sense amplifiers 25-1 to 25-(1+p) in the replacement data cell array 2. The replacement data includes the replacement confirmation data and the address data.

The write control circuit 7 outputs write data to be inputted to the replacement data cell array 2 (during a replacement data setting) or the memory cell array 3 (during an ordinary write operation), to the write circuit. The write circuit 8 outputs the write data to the replacement data cell array 2 (during the replacement data setting) or the memory cell array 3 (during the ordinary write operation).

The multiplexer 9 outputs a plurality of pieces of data selected from those output from the sense amplifiers 35-1 to 35-(m+n) during the read operation based on the replacement data.

The replacement data cell array 2 will be described in more detail.

Figure 2:
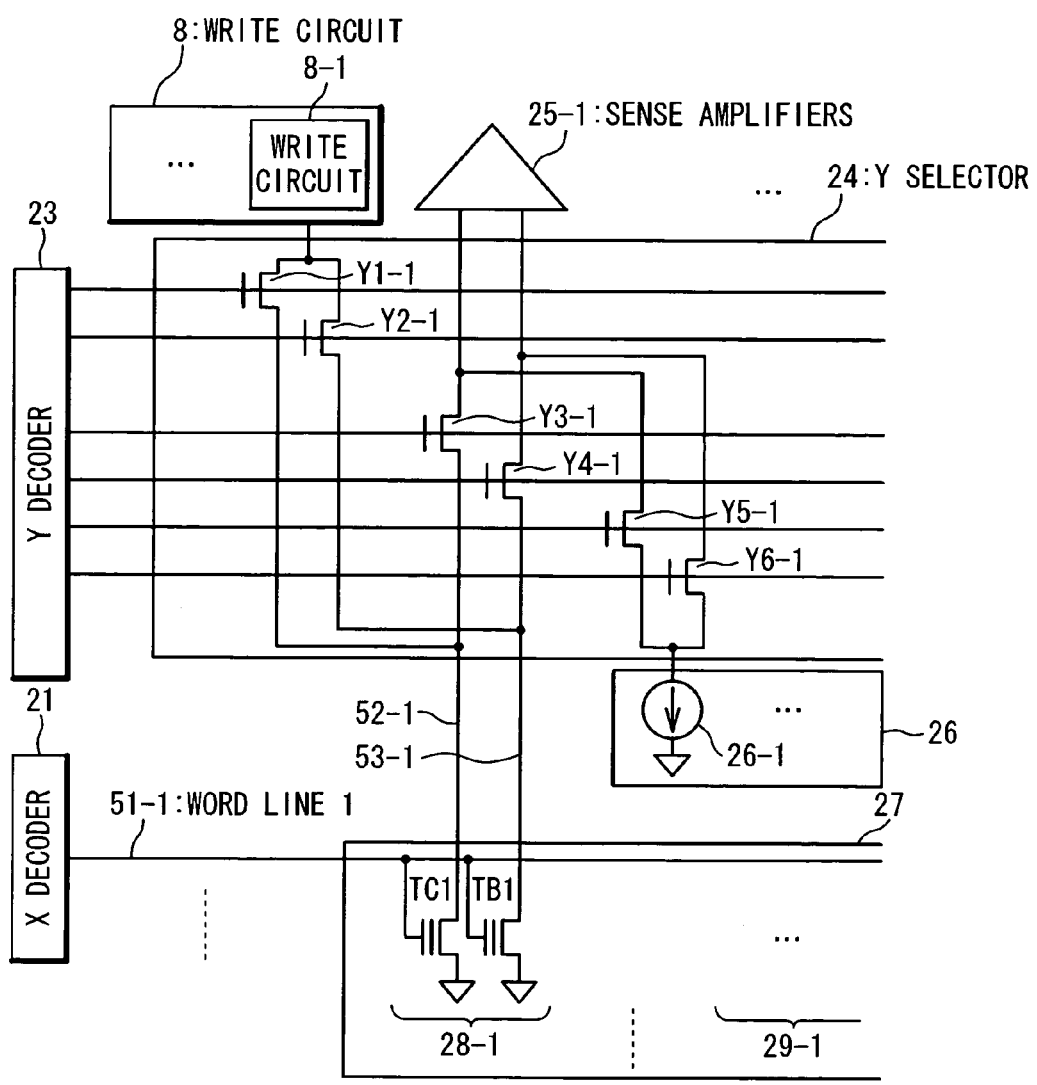
FIG. 2 is a block diagram showing a configuration of a replacement data cell array.

FIG. 2 is a block diagram showing a configuration of the replacement data cell array 2. In FIG. 2, a configuration related to data erasure is omitted. In addition, among the cell arrays 27 each including the complementary cells (the first nonvolatile memory cells TC and the second nonvolatile memory cells TB) arranged in a matrix, only configurations of the complementary cells in the first row and first column (the complementary cells 28-1) and the related elements are shown. Configurations of the other complementary cells in the first row (not shown; the complementary cells 29-1), those in the second and the following rows (not shown; the complementary cells 28-2 and 29-2 to 28-m and 29-m), and the related elements are the same to those shown in FIG. 2. Indexes -1 to -(1+p) correspond to column numbers. Indexes -1 to -m correspond to row numbers.

In the cell array 27, complementary cells are arranged in a matrix. A control gate, a drain, and a source of the first nonvolatile memory cell TC1 are connected to the first bit line 52-1, the word line 51-1, and a ground, respectively. A control gate, a drain, and a source of the second nonvolatile memory cell TB are connected to the second bit line 53-1, the word line 51-1, and the ground, respectively.

The first bit line 52-1 is connected to the sense amplifier 25-1 through a transistor Y3-1 of the Y selector 24. The second bit line 53-1 is connected to the sense amplifier 25-1 through a transistor Y4-1 of the Y selector 24. The transistors Y3-1 and Y4-1 are turned on or off in response to the signal from the Y decoder 23.

A write circuit 8-1 is connected to the first nonvolatile memory cell TC1 and the transistor Y3-1 on the first bit line 52-1 through a transistor Y1-1 of the Y selector 24. In addition, the write circuit 8-1 is connected to the second nonvolatile memory cell TB1 and the transistor Y4-1 on the second bit line 53-1 through a transistor Y2-1 of the Y selector 24. The transistor Y1-1 and a transistor Y2-1 are turned on or off in response to the signal from the Y decoder 23.

The constant-current circuit 26-1 is connected to the transistor Y3-1 and the sense amplifier 25-1 on the first bit line 52-1 through a transistor Y5-1 of the Y selector 24. In addition, the constant-current circuit 26-1 is connected to the transistor Y4-1 and the sense amplifier 25-1 on the second bit line 53-1 through a transistor Y6-1 of the Y selector 24. The transistors Y5-1 and Y6-1 are turned on or off in response to the signal from the Y decoder 23.

Figure 3:
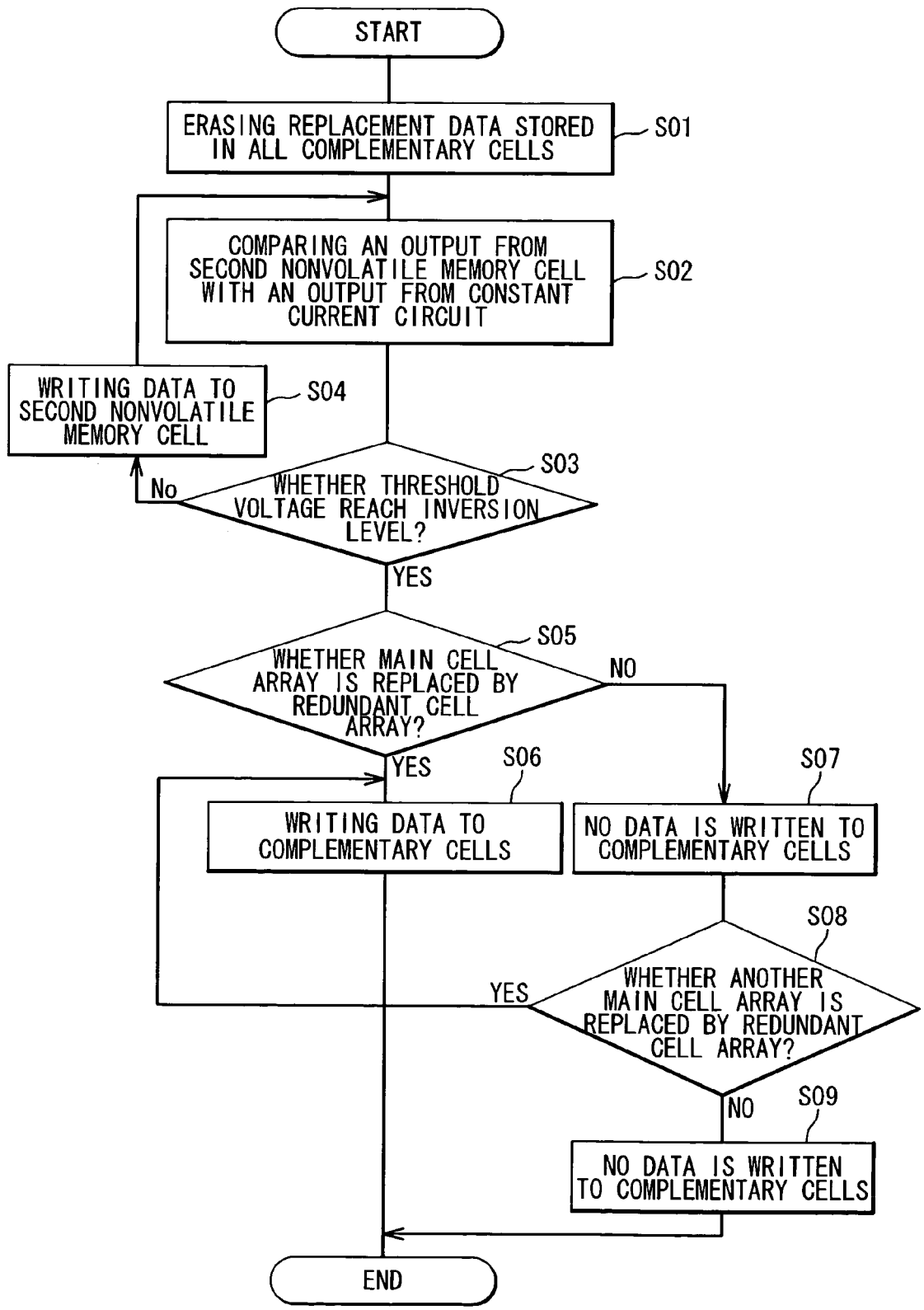
FIG. 3 is a flowchart showing a method for setting replacement information on the nonvolatile semiconductor memory according to the first embodiment of the present invention.

The method for setting replacement information (replacement data) on the nonvolatile semiconductor memory according to the first embodiment of the present invention will be described below. FIG. 3 is a flowchart showing the method for setting replacement information (replacement data) on the nonvolatile semiconductor memory according to the first embodiment of the present invention.

First, pieces of data stored in all the nonvolatile memory cells in the complementary cells (28 and 29) in the replacement data cell array 2 are erased (in a step S01).

The X decoder 21 selects all word lines 51 (51-1 to 51-$m$) based on the control signal from the control circuit 4. Accordingly, control gates of the respective complementary cells (28 and 29) are connected to a first erasure circuit (not shown). The Y decoder 23 selects all the first bit lines 52-1 to 52-(1+p) and all the second bit lines 53-1 to 53-(1+p) using the Y selector 24 based on the control signal from the control circuit 4. Accordingly, drains of the respective complementary cells (28 and 29) are connected to a second erasure circuit (not shown). By causing the first erasure circuit and the second erasure circuit to apply predetermined voltages to the cells, data in all the complementary cells (28 and 29) are erased (in the step S01). Thereafter, selection states by the X decoder 21 and the Y decoder 23 (Y selector 24) are released.

Next, an intermediate level is written to all of the second nonvolatile memory cells TB in all of the complementary cells (28 and 29) in the replacement data cell array 2 (in steps S02 to S04). The intermediate level is a predetermined threshold voltage Vt set between a highest threshold voltage Vt settable for the nonvolatile memory cells and a threshold voltage Vt corresponding to an erasure state.

Data is read from all of the second nonvolatile memory cells TB. The Y decoder 23 selects the second bit line 53-1 by the transistor Y4-1 of the Y selector 24 based on the control signal from the control circuit 4 and an address signal from the address buffer 5. The drain of the second nonvolatile memory cell TB1 is connected to one of terminals of the sense amplifier 25-1. At the same time, the X decoder 21 selects the word line 51-1 based on the control signal from the control circuit 4 and the address signal from the address buffer 5. The predetermined read voltage is applied to the control gate of the second nonvolatile memory cell TB1. Accordingly, a current corresponding to a level of a floating gate of the second nonvolatile memory cell TB1 (hereinafter, "first cell current") is outputted to one of the terminals of the sense amplifier 25-1 through the second bit line 53-1.

Meanwhile, the Y decoder 23 selects the constant-current circuit 26-1 by the transistor Y5-1 of the Y selector 24 based on the control signal from the control circuit 4 and the address signal from the address buffer 5. Accordingly, the constant-current circuit 26-1 is connected to the other terminal of the sense amplifier 25-1. The constant-current circuit 26-1 outputs a predetermined current (hereinafter, "first constant current") to the other terminal of the sense amplifier 25-1. It is noted that the first constant current is equal to a current output when the nonvolatile memory cell is at the intermediate level.

The sense amplifier 25-1 compares the respective currents supplied thereto with each other and outputs a comparison result. As the comparison result, if the first cell current is equal to or higher than the first constant current, the sense amplifier 25-1 outputs "1" indicating that the threshold voltage of the second nonvolatile memory cell TB1 does not reach a predetermined level (inverted level). If the first cell current is lower than the first constant current, the sense amplifier 25-1 outputs "0" indicating that the threshold voltage of the second nonvolatile memory cell TB1 reaches the inverted level. The comparison result is outputted to the replacement data decoder 6 (in the step S02). The voltage applied to the nonvolatile memory cell in this read operation and time for the application of the voltage are equal to those in the ordinary read operation.

Thereafter, the selection states by the X decoder 21 and the Y decoder 23 (Y selector 24) are released.

The data in each second nonvolatile memory cell TB is then determined. The replacement data decoder 6 outputs the comparison result to the write control circuit 7. The write control circuit 8 determines whether the comparison result is "1" or "0" (in a step S03).

If the comparison result is "1", the threshold voltage of the second nonvolatile memory cell TB1 does not reach the intermediate level (inversion level). Data is written to the second nonvolatile memory cell TB1, accordingly. Due to this, the write control circuit 7 outputs a write control signal to each of the write circuit 8 (the write circuit 8-1), the X decoder 21, and the Y decoder 23.

The Y decoder 23 selects the second bit line 53-1 by the transistor Y2-1 of the Y selector 24 based on the write control signal from the write control circuit 8. The drain of the second nonvolatile memory cell TB is connected to the write circuit 8-1. The write circuit 8-1 applies a predetermined write voltage to the drain of the second nonvolatile memory cell TB. At the same time, the X decoder 21 selects the word line 51-1 based on the write control signal from the write control circuit 8. The predetermined write voltage is applied to the control gate of the second nonvolatile memory cell TB1. Accordingly, a predetermined charge is injected into the floating gate of the second nonvolatile memory cell TB1, thereby raising the level of the threshold voltage of the second nonvolatile memory cell TB1 (in a step S04). The voltage applied to the nonvolatile memory cell in this write operation and the time for application of the voltage differ from those in the ordinary write operation. The write voltage is set relatively low but is increased step by step as the operation advances. The time is set relatively short.

Thereafter, the selection states by the X decoder 21 and the Y decoder 23 (Y selector 24) are released. The processing returns to the step S02 and the operation in the step S02 is performed.

If the comparison result is "0", the threshold voltage of the second nonvolatile memory cell TB1 reaches the intermediate level (inversion level). The write operation is, therefore, finished.

In this embodiment, the operations in the steps S02 to S04 are performed on the second nonvolatile memory cell TB1 in the complementary cell 28 in the first row and first column. Actually, however, the operations are performed on all the other second nonvolatile memory cells TB. For example, the above-stated processing can be performed on the second nonvolatile memory cell TB on the same word line 51-1. The above-stated processing can be performed on the second nonvolatile memory cell TB on the word lines 51 in the other columns.

As a result, the first nonvolatile memory cells TC are set into erasure states and the second nonvolatile memory cells TB are set into write states in all the complementary cells 28 and 29. These states are non-replacement states each indicating that the corresponding redundant cell array 41 does not replace the main cell array 42 and that the address of the main cell array 42 is not inputted.

Next, the main cell array 42, in which a defect is detected, is replaced by the redundant cell array 41 (in steps S05 to S09).

When the nonvolatile semiconductor memory 1 is tested, it is checked whether a defect is present in the cell array 37 of each of the main cell arrays 42-1 to 42-n, and determined whether the main cell array 42 is replaced by the redundant cell array 41 (in the step S05). If a main cell array 42-x, in which a defect is detected, is to be replaced by a redundant cell array 41-y (ex. 41-1 in this embodiment), the following write operation is performed on the complementary cells 28 and 29.

The control circuit 4 receives the control signal for indicating the replacement data to be written, the address data indicating the addresses of the main cell array 42-x to be replaced by the redundant cell array 41-1, and the number of the redundant cell array 41-1 to replace the main cell array 42-x.

The X decoder 21 selects the word line 51-1 of the cell array 27-1 corresponding to the replacing redundant cell array 41-1 based on the control signal from the control circuit 4 and the address signal from the address buffer 5. Accordingly, the predetermined write voltage is applied to the control gate of each of the complementary cells 28-1 and 29-1 corresponding to the redundant cell array 41-1. At the same time, the Y decoder 23 selects all the first bit lines 52-1 to 52-(1+p) by the Y selector 24 based on the control signal from the control circuit 4 and the address signal from the address buffer 5. As a result, the drains of the respective complementary cells 28-1 and 29-1 are connected to the write circuit 8.

The write control circuit 7 outputs the write control signal to the write circuit 8 so as to write data to the first nonvolatile memory cells TC1 to TC(1+p) in the complementary cells 28-1 and 29-1 corresponding to the replacement confirmation data and the address data based on the control signal from the control circuit 4. The write circuit 8 applies the predetermined voltage to the bit line 52-1 connected to the first nonvolatile memory cells TC1 to TC(1+p) in the complementary cells 28-1 and 29-1 corresponding to the replacement confirmation data and the address data. As a result, the predetermined write voltage is applied to the drains of the first nonvolatile memory cells TC1 to TC(1+p).

By applying the predetermined write voltage to each of the control gates and the drains thereof, a predetermined charge is injected into the floating gate of each of the first nonvolatile memory cells TC1 to TC(1+p) thereby data is written to the first nonvolatile memory cells TC1 to TC(1+p) (in the step S06). The voltage applied to each nonvolatile memory cell in this write operation differs from that applied in the ordinary write operation. The write voltage is set to the threshold voltage sufficiently higher than the intermediate level. The "sufficiently higher voltage" means the voltage so that the difference between the cell and the intermediate level cell is great and so that no read error occurs.

If the main cell array 42, in which a defect is detected and which is replaced by the redundant cell array 41, is not present, no data is written to the complementary cells (in the step S07). It is then checked whether a defect is present in the cell array 37 in each of the other main cell arrays 42-1 to 42-n (in the step S08). If the defect is detected, the operation in the step S06 is performed. If no defect is detected, no data is written to the complementary cells (in the step S09).

Through the steps S01 to S09, the replacement information (replacement data) in the nonvolatile semiconductor memory is set.

Figure 4:
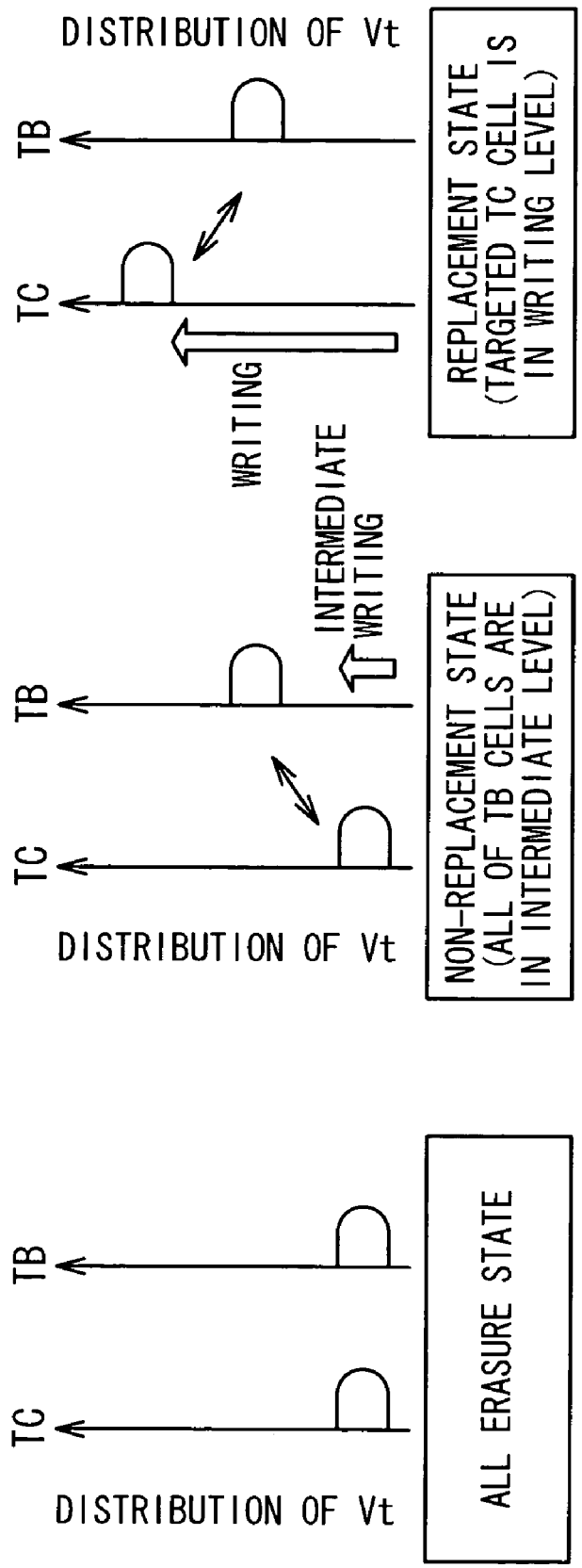
FIGS. 4A to 4C shows threshold voltage states in a first nonvolatile memory cell and a second nonvolatile memory cell.

FIG. 4 shows threshold voltage states in a first nonvolatile memory cell and a second nonvolatile memory cell for the setting method described above. The vertical axis indicates a distribution of the threshold voltage Vt of the nonvolatile memory cells. FIG. 4A shows a state in which data stored in the second nonvolatile memory cell TB and the first nonvolatile memory cell TC is all erased after the step S01. Each of the first nonvolatile memory cell TC and the second nonvolatile memory cell TB has the low threshold voltage Vt. FIG. 4B shows a non-replacement state in which the intermediate level is written to all the second nonvolatile memory cells TB after the steps S02 to S04. The threshold voltage Vt of the second nonvolatile memory cells TB is the intermediate level. FIG. 4C shows a replacement state in which data is written to the target first nonvolatile memory cell TC after the step S06. The threshold voltage Vt of the first nonvolatile memory cell is higher than the intermediate level.

According to the present invention, nonvolatile memory cells (TC and TB) of two bits are used for one-bit replacement data, and complementary data is allocated to the nonvolatile memory cells of two bits, respectively. In the read operation, one sense amplifier complementarily reads data from the nonvolatile memory cells (TC and TB) of two bits to which the respective complementary data is allocated. Namely, the replacement data can be promptly and accurately read.

Further, as shown in FIG. 4, three states are set to the threshold voltage, the write data is set to about the highest threshold voltage Vt settable for the nonvolatile memory cells, the intermediate write level is set to about the intermediate level between the erasure state level and the write level, whereby a very wide margin can be secured between the nonvolatile memory cells TC and TB. It is thereby possible to eliminate write error and read error. Data can be read at higher rate, accordingly.

Moreover, after the threshold voltage is temporarily set to the non-replacement state (FIG. 4B), the threshold voltage can be set to the replacement state (FIG. 4C) for each nonvolatile memory cell without performing the erasure operation to all of the complimentary cells 28 and 29. It is, therefore, possible to set the replacement data relatively in short time.

In this first embodiment, in the setting of the replacement information (replacement data) on the nonvolatile semiconductor memory, if the replacement data is additionally set, then the processing may be moved from the step S08 to the step S06 and the replacement data may be additionally written to the target pair of complementary cells. That is, it is unnecessary to perform erasure and reset for all the complementary cells within the replacement data cell array 2. The additional setting of the replacement data can be, therefore, easily executed in the short time.

This is an advantage over the fourth embodiment (to be described later) in which it is necessary to perform erasure and reset for all the complementary cells during additional write operation.

Figure 6:
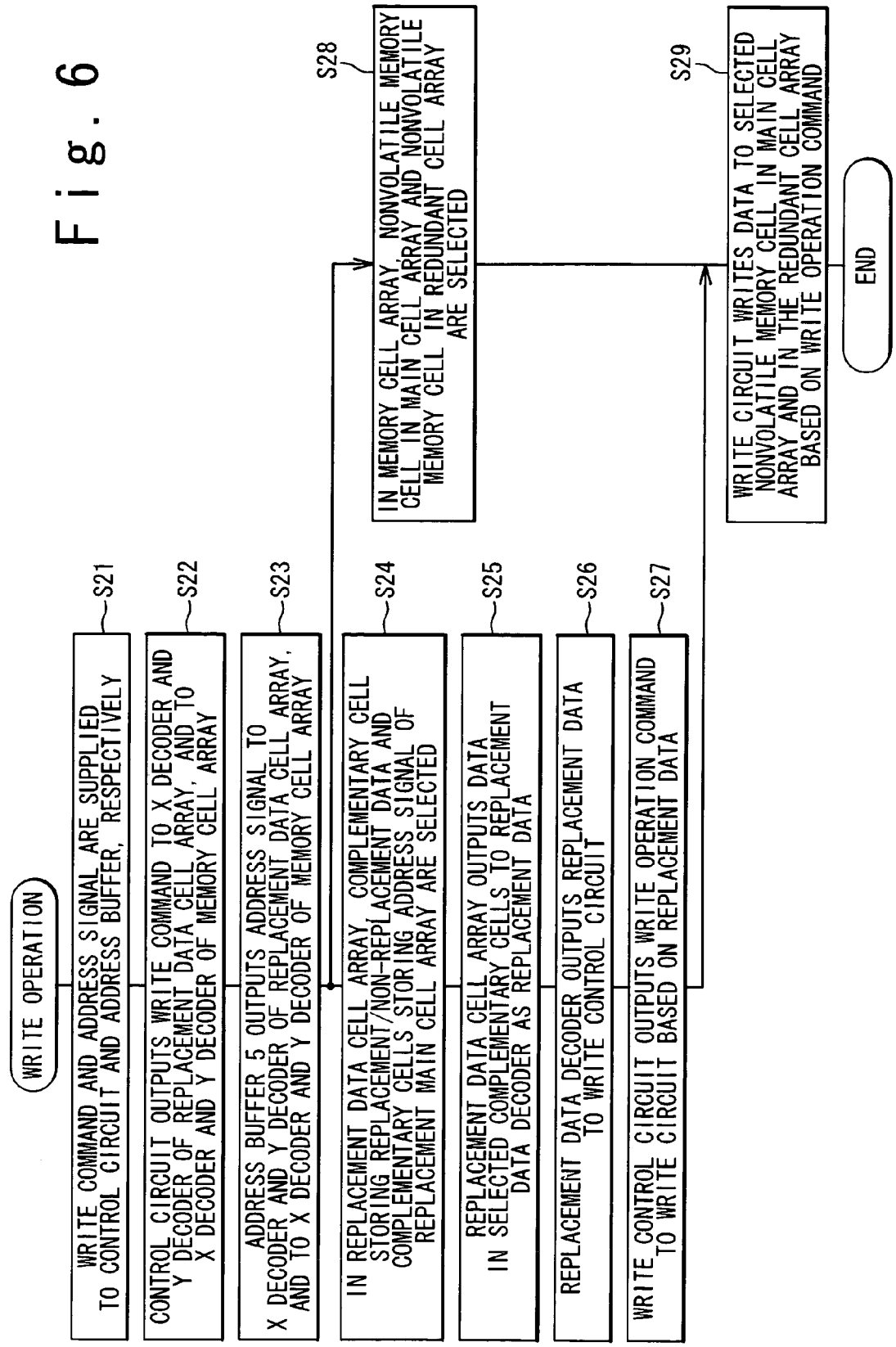
FIG. 6 is a flowchart showing a data write operation performed by the nonvolatile semiconductor memory according to the present invention.

A data write operation performed by the nonvolatile semiconductor memory will be described below. FIG. 6 is a flowchart showing the data write operation performed by the nonvolatile semiconductor memory according to the present invention.

A write command and an address signal are supplied to the control circuit 4 and the address buffer 5, respectively (in a step S21). The control circuit 22 outputs the write command to the X decoder 21 and the Y decoder 23 of the replacement data cell array 2, and to the X decoder 31 and the Y decoder 33 of the memory cell array 3 (in a step S22). The address buffer 5 outputs the address signal to the X decoder 21, the Y decoder 23, the X decoder 31, and the Y decoder 33 (in a step S23). In the replacement data cell array 2, the complementary cell 28 storing replacement or non-replacement data and the plurality of complementary cells 29 storing the address signal of the replacement target main cell array 42 are selected (in a step S24). The replacement data cell array 2 outputs the data of the selected complementary cells 28 and 29 to the replacement data decoder 6 as the replacement data (in a step S25). The replacement data decoder 6 outputs the replacement data to the write control circuit 7 (in a step S26). The write control circuit 7 outputs a predetermined write operation command to the write circuit 8 based on the replacement data (in a step S27) In the memory cell array 3, a nonvolatile memory cell in the main cell array 42 and a nonvolatile memory cell in the redundant cell array 41 are selected (in a step S28). The write circuit 8 writes data to the selected nonvolatile memory cell in the main cell array 42 and that in the redundant cell array 41 based on the write operation command (in a step S29).

The data write operation is thus performed.

Figure 7:
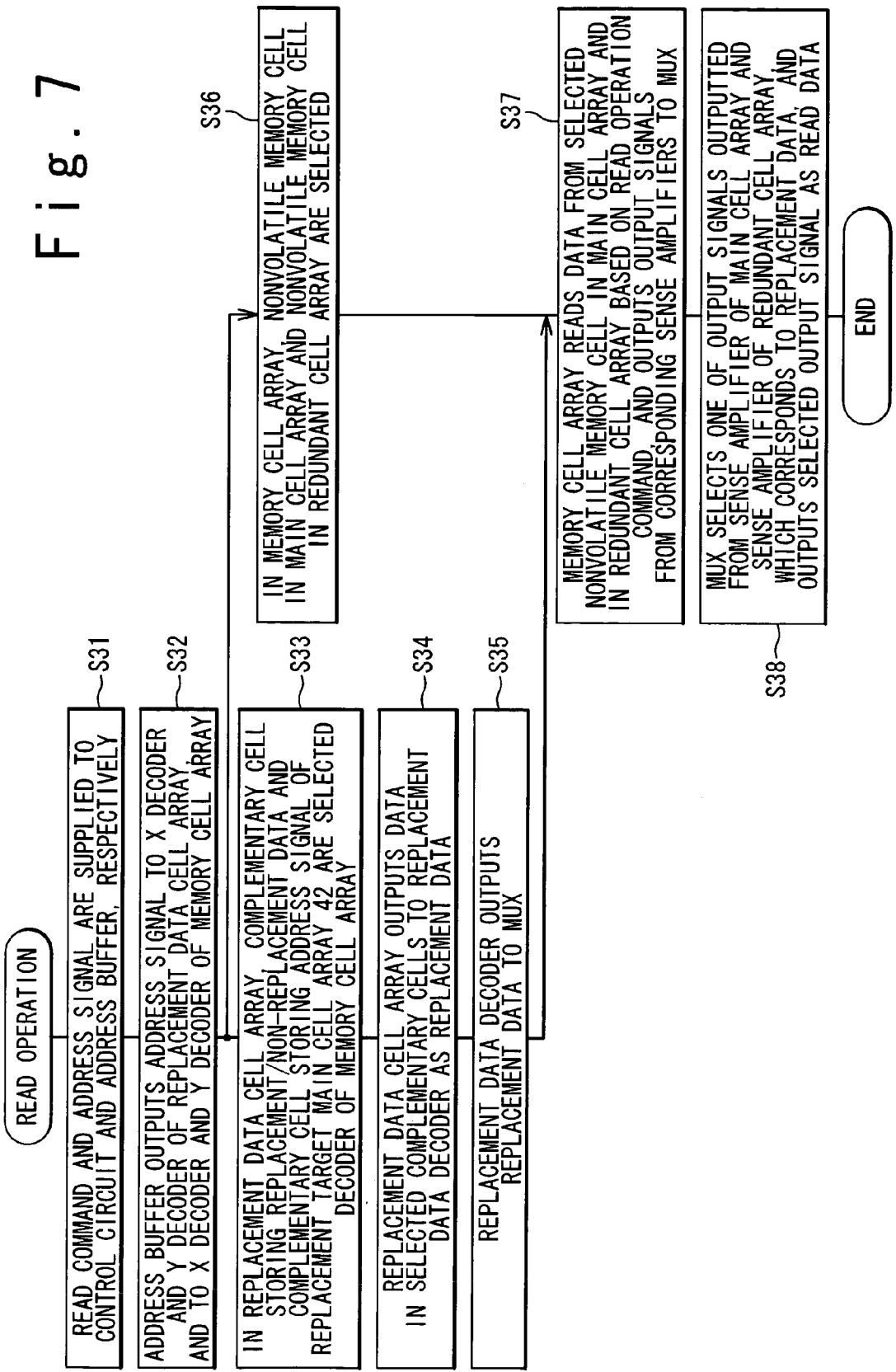
FIG. 7 is a flowchart showing a data read operation performed by the nonvolatile semiconductor memory according to the present invention.

A data read operation performed by the nonvolatile semiconductor memory will be described below. FIG. 7 is a flowchart showing the data read operation performed by the nonvolatile semiconductor memory according to the present invention.

A read command and an address signal are supplied to the control circuit 4 and the address buffer 5, respectively (in a step S31). The address buffer 5 outputs the address signal to the X decoder 21 and the Y decoder 23 of the replacement data cell array 2, and to the X decoder 31 and the Y decoder 33 of the memory cell array 3 (in a step S32). In the replacement data cell array 2, the complementary cell 28 storing replacement or non-replacement data and the complementary cell 29 storing the address signal of the replacement target main cell array 42 are selected (in a step S33). The replacement data cell array 2 outputs the data of the selected complementary cells 28 and 29 to the replacement data decoder 6 as the replacement data (in a step S34). The replacement data decoder 6 outputs the replacement data to the MUX 9 (in a step S35). In the memory cell array 3, a nonvolatile memory cell in the main cell array 42 and a nonvolatile memory cell in the redundant cell array 41 are selected (in a step S36). The memory cell array 3 reads data from the selected nonvolatile memory cell in the main cell array 42 and that in the redundant cell array 41 based on the read operation command, and outputs the output signals from the corresponding sense amplifiers to the MUX 9 (in a step S37). The MUX 9 selects one of output signals outputted from the sense amplifier 35 of the main cell array 42 and the sense amplifier 35 of the redundant cell array 41, which corresponds to the replacement data, and outputs the selected output signal as read data (in a step S38).

The data read operation is thus performed.

Second Embodiment

A nonvolatile semiconductor memory and a method for setting replacement information on the nonvolatile semiconductor memory according to a second embodiment of the present invention will be described with reference to the attached drawings. Since a configuration of the nonvolatile semiconductor memory according to the second embodiment is the same as that of the nonvolatile semiconductor memory according to the first embodiment (shown in FIGS. 1 and 2), it will not be described herein.

A flow of the method for setting replacement information in the nonvolatile semiconductor memory according to the second embodiment of the present invention differs from that according to the first embodiment in the point that the steps S02 to S04 are replaced by steps S02' to S04' to be described later. The steps S02' to S04' will now be described below. Since the remaining steps according to the second embodiment are the same as those according to the first embodiment (shown in FIG. 3), they will not be described herein.

In the steps S02' to S04', the intermediate level is written to all the second nonvolatile memory cells TB in the complementary cells (28 and 29) in the replacement data cell array 2 as follows.

First, data is read from all the second nonvolatile memory cells TB.

As for the first nonvolatile memory cell TC1, the Y decoder 23 selects the first bit line 52-1 by the transistor Y3-1 of the Y selector 24 based on the control signal from the control circuit 4 and the address signal from the address buffer 5. The drain of the first nonvolatile memory cell TC1 is connected to one of the terminals of the sense amplifier 25-1. At the same time, the X decoder 21 selects the word line 51-1 based on the control signal from the control circuit 4 and the address signal from the address buffer 5. The predetermined read voltage is applied to the control gate of the first nonvolatile memory cell TC1. Accordingly, a current corresponding to the level of the floating gate of the first nonvolatile memory cell TC1 (hereinafter, "third cell current") is outputted to one of the terminals of the sense amplifier 25-1 through the first bit line 52-1.

As for the second nonvolatile memory cell TB1, the Y decoder 23 selects the second bit line 53-1 by the transistor Y4-1 of the Y selector 24 based on the control signal from the control circuit 4 and the address signal from the address buffer 5. The drain of the second nonvolatile memory cell TB1 is connected to the other terminal of the sense amplifier 25-1. The X decoder 21 selects the word line 51-1. The predetermined read voltage is applied to the control gate of the second nonvolatile memory cell TB1. Accordingly, a current corresponding to the level of the floating gate of the second nonvolatile memory cell TB1 (hereinafter, "fourth cell current") is outputted to the other terminal of the sense amplifier 25-1 through the second bit line 53-1. Furthermore, the Y decoder 23 selects the transistor Y6-1 of the Y selector 24 and connects the second bit line 53-1 to the constant-current circuit 26-1. Accordingly, current set to the constant-current circuit 26-1 (hereinafter, "second constant current") is outputted to the other terminal of the sense amplifier 25-1 through the second bit line 53-1. Namely, a sum of the fourth cell current and the second constant current is supplied to the other terminal of the sense amplifier 25-1.

The second constant current is determined in view of a threshold voltage difference due to manufacturing variations of the nonvolatile memory cells. That is, a margin is secured so that all the second nonvolatile memory cells TB1 have the intermediate level.

The sense amplifier 25-1 compares the respective currents supplied thereto with each other and outputs a comparison result. As the comparison result, if the third cell current is, for example, equal to or lower than the sum of the fourth cell current and the second constant current, the sense amplifier 25-1 outputs "1" indicating that the threshold voltage of the second nonvolatile memory cell does not reach the predetermined level (inverted level). If the third cell current is higher than the sum of the fourth cell current and the second constant current, the sense amplifier 25-1 outputs "0" indicating that the threshold voltage of the second nonvolatile memory cell reaches the inverted level. The comparison result is outputted to the replacement data decoder 6 (in the step S02'). The voltage applied to the nonvolatile memory cell in this read operation and time for the application of the voltage are equal to those in the ordinary read operation.

Thereafter, the selection states by the X decoder 21 and the Y decoder 23 (Y selector 24) are released.

The replacement data decoder 6 outputs the comparison result to the write control circuit 7. The write control circuit 8 determines whether the comparison result is "1" or "0" (in the step S03').

If the comparison result is "1", the threshold voltage of the second nonvolatile memory cell TB1 does not reach the inverted level. Data is written to the second nonvolatile memory cell TB1, accordingly. Due to this, the write circuit 8 (the write circuit 8-1) outputs a write control signal to each of the X decoder 21 and the Y decoder 23.

The Y decoder 23 selects the second bit line 53-1 by the transistor Y2-1 of the Y selector 24 based on the write control signal from the write control circuit 8. The drain of the second nonvolatile memory cell TB is connected to the write circuit 8-1. The write circuit 8-1 applies a predetermined write voltage to the drain of the second nonvolatile memory cell TB. At the same time, the X decoder 21 selects the word line 51-1 based on the write control signal from the write control circuit 8. The predetermined write voltage is applied to the control gate of the second nonvolatile memory cell TB1. Accordingly, a predetermined charge is injected into the floating gate of the second nonvolatile memory cell TB1, thereby raising the level of the threshold voltage of the second nonvolatile memory cell TB1 (in the step S04'). The voltage applied to the nonvolatile memory cell in this write operation and the time for application of the voltage differ from those in the ordinary write operation. The write voltage is set relatively low but is increased step by step as the operation advances. The time is set relatively short.

Thereafter, the selection states by the X decoder 21 and the Y decoder 23 (Y selector 24) are released. The processing returns to the step S02' and the operation in the step S02' is performed.

If the comparison result is "0", the threshold voltage of the second nonvolatile memory cell TB1 reaches the inverted level. The write operation is, therefore, finished.

In this embodiment, the operations in the steps S02' to S04' are performed on the second nonvolatile memory cell TB1 in the complementary cell 28 in the first row and first column. Actually, however, the operations are performed on all the other second nonvolatile memory cells TB. For example, the above-stated processing can be performed on the second nonvolatile memory cell TB on the same word line 51-1. The above-stated processing can be performed on the second nonvolatile memory cells TB on the word lines 51 in the other columns.

As a result, the first nonvolatile memory cells TC are set into erasure states and the second nonvolatile memory cells TB are set into write states in all the complementary cells 28 and 29. These states are non-replacement states each indicating that the corresponding redundant cell array 41 does not replace the main cell array 42 and that the addresses of the main cell array 42 are not inputted.

In this embodiment, the threshold voltages of the complementary cells are in the states shown in FIG. 4. FIG. 4B shows the non-replacement state in which the intermediate level is written to all the second nonvolatile memory cells TB after the steps S02' to S04'. FIG. 4A shows the full erasure state, and FIG. 4C shows the replacement state.

The data write operation and read operation performed by such a nonvolatile semiconductor memory are the same as those according to the first embodiment. They will not be, therefore, described herein.

According to the present invention, the same advantages as those of the first embodiment can be attained. Besides, since it suffices that the current generated by the constant-current circuit 26 falls within the range corresponding to variations in the threshold voltage of the second nonvolatile memory cells, the current is lower than that in the steps S02 to S04.

Third Embodiment

A nonvolatile semiconductor memory and a method for setting replacement information on the nonvolatile semiconductor memory according to a third embodiment of the present invention will be described with reference to the attached drawings. A configuration of the nonvolatile semiconductor memory according to the third embodiment differs from that of the nonvolatile semiconductor memory according to the first embodiment in the point that the replacement data cell array 2 is replaced by a replacement data cell array 2'. The replacement data cell array 2' will be described hereinafter. Since the other configuration elements are the same as those according to the first embodiment (shown in FIG. 1), they will not be described herein.

Figure 5:
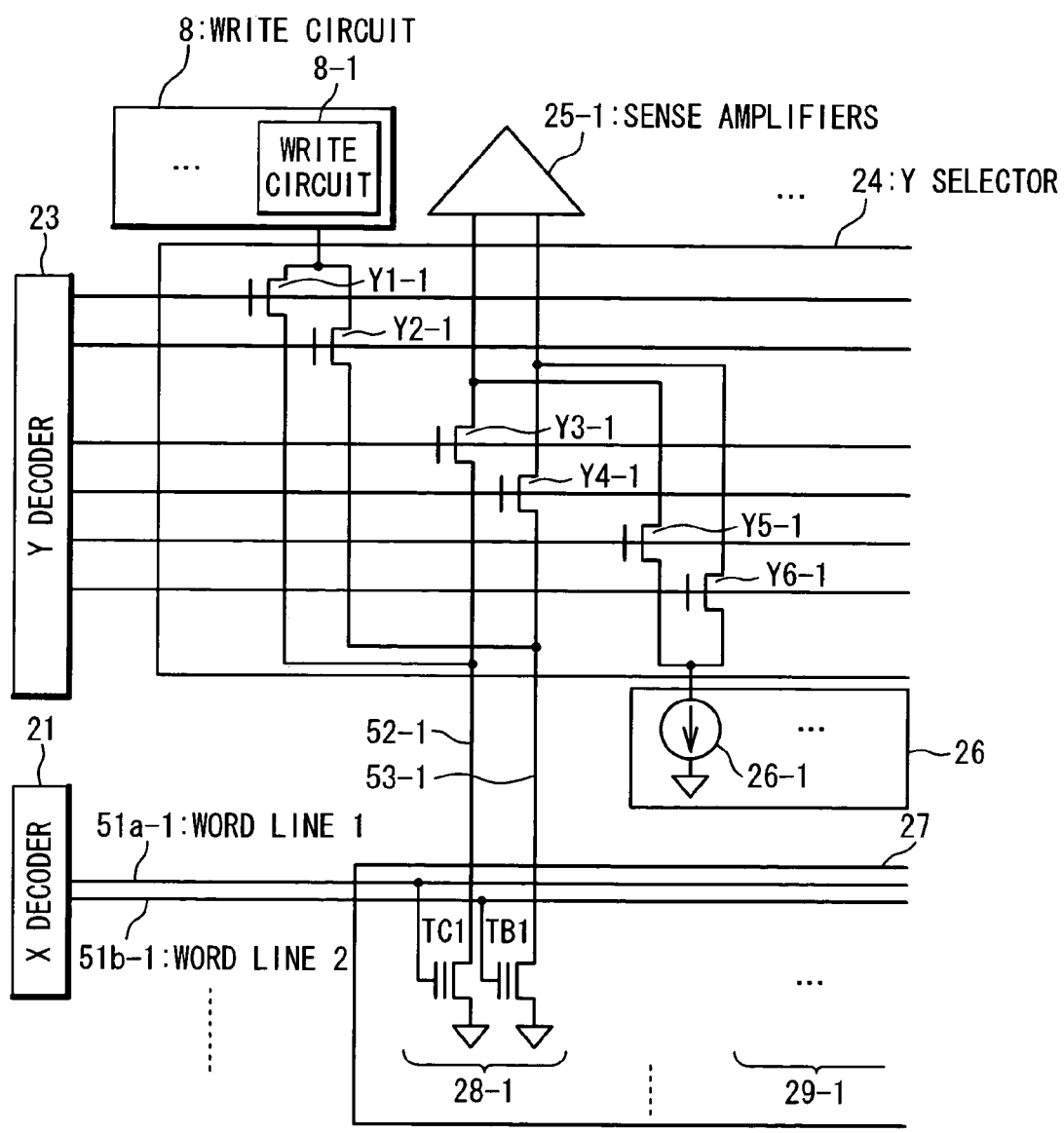
FIG. 5 is a block diagram showing a configuration of the replacement data cell array according to a modification of the present invention.

FIG. 5 is a block diagram showing a configuration of the replacement data cell array 2' (modified embodiment). In this modified embodiment, the replacement data cell array differs from that shown in FIG. 2 in the point that the word line 51 of the X decoder 21 is provided to correspond to each of the nonvolatile memory cells arranged in a row. In this case, the word line 51 connected to the first nonvolatile memory cell in the row is a word line 51a-1, and the word line 51 connected to the second nonvolatile memory cell in the row is a word line 51b-1. The same shall apply hereafter for each row. Since the other configuration elements of the replacement data cell array 2' are the same as those shown in FIG. 2, they will not be described herein.

A flow of the method for setting replacement information on the nonvolatile semiconductor memory according to the third embodiment of the present invention differs from the flow according to the first embodiment in that the steps S02 to S04 are replaced by steps S02" to S04" to be described later. The steps S02" to S04" will now be described below. Since the remaining steps according to the second embodiment are the same as those according to the first embodiment (shown in FIG. 3), they will not be described herein.

The steps S02" to S04" using the configuration shown in FIG. 5 can be executed as follows.

The Y decoder 23 selects the first bit line 52-1 by the transistor Y3-1 of the Y selector 24 based on the control signal from the control circuit 4 and the address signal from the address buffer 5. The drain of the first nonvolatile memory cell TC1 is connected to one of the terminals of the sense amplifier 25-1. At the same time, the X decoder 21 selects the word line 51a-1 based on the control signal from the control circuit 4 and the address signal from the address buffer 5. A predetermined first read voltage is applied to the control gate of the first nonvolatile memory cell TC1. Accordingly, current corresponding to the level of the floating gate of the first nonvolatile memory cell TC1 and to the first voltage (hereinafter, "fifth cell current") is outputted to one of the terminals of the sense amplifier 25-1 through the first bit line 52-1.

At the same time, the Y decoder 23 selects the second bit line 53-1 by the transistor Y4-1 of the Y selector 24 based on the control signal from the control circuit 4 and the address signal from the address buffer 5. The drain of the second nonvolatile memory cell TB1 is connected to the other terminal of the sense amplifier 25-1. At the same time, the X decoder 21 selects the word line 51b-1 based on the control signal from the control circuit 4 and the address signal from the address buffer 5. A predetermined second read voltage is applied to the control gate of the second nonvolatile memory cell TB1. Accordingly, current corresponding to the level of the floating gate of the second nonvolatile memory cell TB1 and to the second voltage (hereinafter, "sixth cell current") is outputted to the other terminal of the sense amplifier 25-1 through the second bit line 53-1. The second voltage is set higher than the first voltage.

The sense amplifier 25-1 compares the respective currents supplied thereto with each other and outputs a comparison result. As the comparison result, if the fifth cell current is equal to or lower than the sixth cell current, for example, the sense amplifier 25-1 outputs "1" indicating that the threshold voltage of the second nonvolatile memory cell does not reach the predetermined level (inverted level). If the fifth cell current is higher than the sixth cell current, the sense amplifier 25-1 outputs "0" indicating that the threshold voltage of the second nonvolatile memory cell reaches the inverted level. The comparison result is output to the replacement data decoder 6 (in the step S02"). The voltage applied to the nonvolatile memory cell in this read operation and time for the application of the voltage are equal to those in the ordinary read operation.

Thereafter, the selection states by the X decoder 21 and the Y decoder 23 (Y selector 24) are released.

The replacement data decoder 6 outputs the comparison result to the write control circuit 7. The write control circuit 8 determines whether the comparison result is "1" or "0" (in the step S03").

If the comparison result is "1", the threshold voltage of the second nonvolatile memory cell TB1 does not reach the intermediate level. Data is written to the second nonvolatile memory cell TB1, accordingly. Due to this, the write circuit 8 (the write circuit 8-1) outputs the write control signal to each of the X decoder 21 and the Y decoder 23.

The Y decoder 23 selects the second bit line 53-1 by the transistor Y2-1 of the Y selector 24 based on the write control signal from the write control circuit 8. The drain of the second nonvolatile memory cell TB is connected to the write circuit 8-1. The write circuit 8-1 applies the predetermined write voltage to the drain of the second nonvolatile memory cell TB1. At the same time, the X decoder 21 selects the word line 51b-1 based on the write control signal from the write control circuit 8. The predetermined write voltage is applied to the control gate of the second nonvolatile memory cell TB1. Accordingly, a predetermined charge is injected into the floating gate of the second nonvolatile memory cell TB1, thereby raising the level of the threshold voltage of the second nonvolatile memory cell TB1 (in the step S04"). The voltage applied to the nonvolatile memory cell in this write operation and the time for application of the voltage differ from those in the ordinary write operation. The write voltage is set relatively low but is increased step by step as the operation advances. The time is set relatively short.

Thereafter, the selection states by the X decoder 21 and the Y decoder 23 (Y selector 24) are released. The processing returns to the step S02" and the operation in the step S02" is performed.

If the comparison result is "0", the threshold voltage of the second nonvolatile memory cell TB reaches the inverted level. The write operation is, therefore, finished.

In this embodiment, the operations in the steps S02" to S04" are performed on the second nonvolatile memory cell TB1 in the complementary cell 28 in the first row and first column. Actually, however, the operations are performed on all of the other second nonvolatile memory cells TB. For example, the above-stated processing can be performed on the second nonvolatile memory cells TB on the same word line 51b-1. The above-stated processing can be performed on the second nonvolatile memory cells TB on the word lines 51 in the other columns.

As a result, the first nonvolatile memory cells TC are set into erasure states and the second nonvolatile memory cells TB are set into write states in all the complementary cells 28 and 29. These states are non-replacement states each indicating that the corresponding redundant cell array 41 does not replace the main cell array 42 and that the addresses of the main cell array 42 are not inputted.

In this embodiment similarly to the third embodiment, the threshold voltages of the complementary cells are in the states shown in FIG. 4. FIG. 4B shows the non-replacement state in which the intermediate level is written to all the second nonvolatile memory cells TB after the steps S02" to S04". FIG. 4A shows the full erasure state, and FIG. 4C shows the replacement state.

The data write operation and read operation performed by such a nonvolatile semiconductor memory are the same as those according to the first embodiment. They will not be, therefore, described herein.

Fourth Embodiment

A nonvolatile semiconductor memory and a method for setting replacement information on the nonvolatile semiconductor memory according to the fourth embodiment of the present invention will be described reference to the attached drawings. Since a configuration of the nonvolatile semiconductor memory according to the fourth embodiment is the same as that of the nonvolatile semiconductor memory according to the first embodiment, it will not be described herein.

Figure 8:
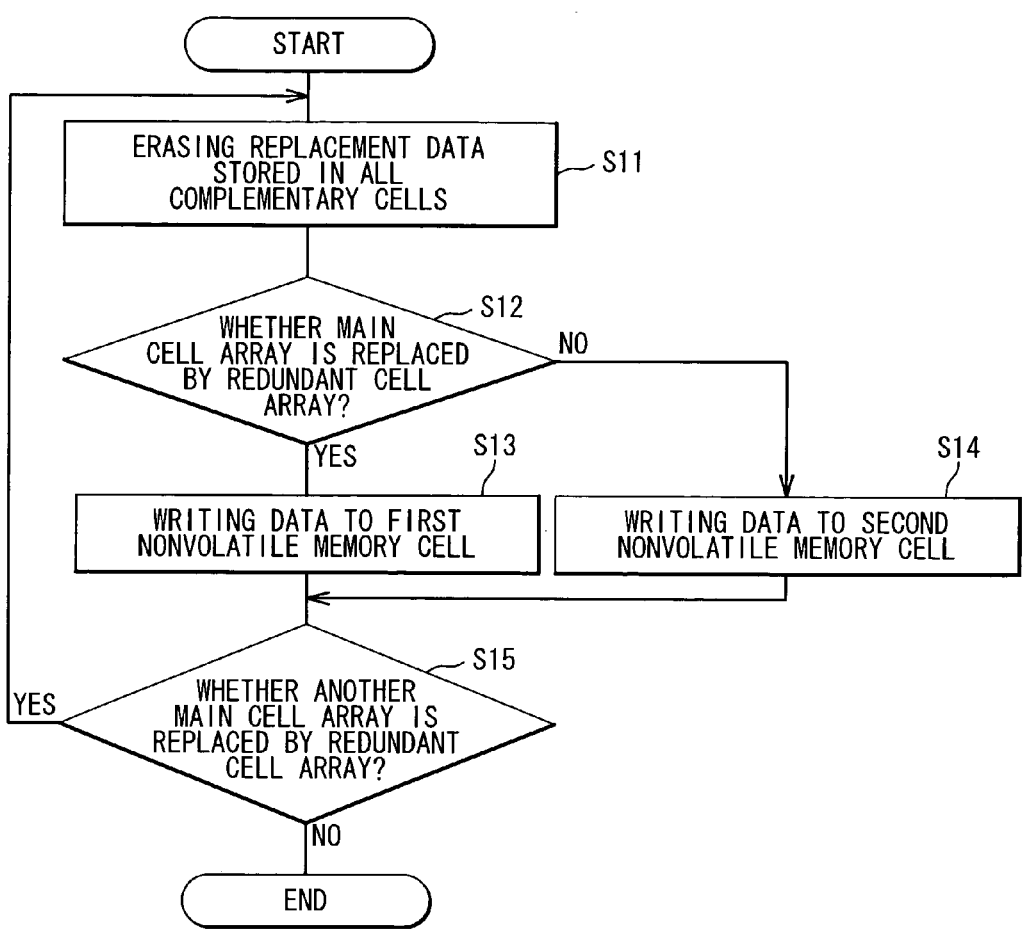
FIG. 8 is a flowchart showing the method for setting replacement information on the nonvolatile semiconductor memory according to a fourth embodiment of the present invention.

The method for setting replacement information on the nonvolatile semiconductor memory according to the fourth embodiment of the present invention will be described below. FIG. 8 is a flowchart showing the method for setting replacement information on the nonvolatile semiconductor memory according to the fourth embodiment of the present invention.

First, pieces of data stored in all the nonvolatile memory cells in the complementary cells (28 and 29) in the replacement data cell array 2 are erased (in a step S11).

The X decoder 21 selects all word lines 51 (51-1 to 51-m) based on the control signal from the control circuit 4. Accordingly, control gates of the respective complementary cells (28 and 29) are connected to the first erasure circuit (not shown). The Y decoder 23 selects all the first bit lines 52-1 to 52-(1+p) and all the second bit lines 53-1 to 53-(1+p) using the Y selector 24 based on the control signal from the control circuit 4. Accordingly, drains of the respective complementary cells (28 and 29) are connected to the second erasure circuit (not shown). By causing the first erasure circuit and the second erasure circuit to apply predetermined voltages to the cells, data in all the complementary cells (28 and 29) are erased (in the step S11). Thereafter, selection by the X decoder 21 and the Y decoder 23 (Y selector 24) is released.

Next, the main cell array 42 for which a defect is detected are replaced by the redundant cell array 41 (in steps S12 to S15).

When the nonvolatile semiconductor memory 1 is tested, it is checked whether a defect is present in the cell array 37 of each of the main cell arrays 42-1 to 42-n, and determined whether the main cell array 42 is replaced by the redundant cell array 41 (in the step S12). If the main cell array 42-x in which a defect is detected is to be replaced by the redundant cell array 41-y (ex. 41-1 in this embodiment), the following write operation is performed on the complementary cells 28 and 29.

The control circuit 4 receives the control signal for indicating the replacement data to be written, the address data indicating the addresses of the main cell array 42-x to be replaced, and the number of the redundant cell array 41-1 to replace the main cell array 42-x.

The X decoder 21 selects the word line 51-1 of the cell array 27-1 corresponding to the replacing redundant cell array 41-1 based on the control signal from the control circuit 4 and the address signal from the address buffer 5. Accordingly, the predetermined write voltage is applied to each of the complementary cells 28-1 and 29-1 corresponding to the redundant cell array 41-1. At the same time, the Y decoder 23 selects all the first bit lines 52-1 to 52-(1+p) by the Y selector 24. As a result, the drains of the respective complementary cells 28-1 and 29-1 are connected to the write circuit 8.

The write control circuit 7 outputs the write control signal to the write circuit 8 so as to write data to the first nonvolatile memory cells TC1 to TC(1+p) in the complementary cells 28-1 and 29-1 corresponding to the replacement confirmation data and the address data based on the control signal from the control circuit 4. The write circuit 8 applies the predetermined voltage to the bit line 52-1 connected to the first nonvolatile memory cells TC1 to TC(1+p) in the complementary cells 28-1 and 29-1 corresponding to the replacement confirmation data and the address data. As a result, the predetermined write voltage is applied to the drains of the first nonvolatile memory cells TC1 to TC(1+p).

By applying the predetermined write voltage to each of the control gates and the drains thereof, a predetermined charge is injected into the floating gate of the first nonvolatile memory cell TC1, and data is written to the first nonvolatile memory cell (in a step S13).

If the main cell array 42 for which a defect is detected and which is replaced by the redundant cell array 41 is not present, the following write operation is performed on the complementary cells.

The control circuit 4 receives the control signal for indicating the replacement data to be written, the address data indicating the addresses of the main cell array 42-x to be replaced by the redundant cell array 41-1, and the number of the redundant cell array 41-1 to replace the main cell array 42-x.

The X decoder 21 selects the word line 51-1 of the cell array 27-1 corresponding to the replacing redundant cell array 41-1 based on the control signal from the control circuit 4 and the address signal from the address buffer 5. Accordingly, the predetermined write voltage is applied to each of the complementary cells 28-1 and 29-1 corresponding to the redundant cell array 41-1. At the same time, the Y decoder 23 selects all the second bit lines. 53-1 to 53-(1+p) by the Y selector 24 based on the control signal from the control circuit 4 and the address signal from the address buffer 5. As a result, the drains of the respective complementary cells 28-1 and 29-1 are connected to the write circuit 8.

The write control circuit 7 outputs the write control signal to the write circuit 8 so as to write data to the second nonvolatile memory cells TB1 to TB(1+p) in the complementary cells 28-1 and 29-1 corresponding to the replacement confirmation data and the address data based on the control signal from the control circuit 4. The write circuit 8 applies the predetermined voltage to the bit line 53-1 connected to the second nonvolatile memory cells TB1 to TB(1+p) in the complementary cells 28-1 and 29-1 corresponding to the replacement confirmation data and the address data. As a result, the predetermined write voltage is applied to the drains of the second nonvolatile memory cells TB1 to TB(1+p).

By applying the predetermined write voltage to each of the control gates and the drains thereof, a predetermined charge is injected into the floating gate of the second nonvolatile memory cell TB1, thereby data is written to the second nonvolatile memory cell TB1 (in a step S14).

It is then checked whether a defect is present in the cell array 37 in each of the other main cell arrays 42-1 to 42-n (in a step S15). If the defect is detected, operation in the step S11 and the following are executed again. If no defect is detected, no data is written to the complementary cells.

Through the steps S11 to S15, the replacement information (replacement data) on the nonvolatile semiconductor memory is set.

FIG. 9 shows threshold voltage states in the nonvolatile memory cell for the setting method stated above. The vertical axis indicates the distribution of the threshold voltage Vt of the nonvolatile memory cells. FIG. 9A shows a state in which data stored in the first nonvolatile memory cells TB and the second nonvolatile memory cells TC is all erased after the step S11. Each of the first nonvolatile memory cells TC and the second nonvolatile memory cells TB has the low threshold voltage Vt. FIG. 9B shows a non-replacement state in which ordinary data write operation is performed on all the second nonvolatile memory cells TB after the step S14. The threshold voltage Vt of the second nonvolatile memory cell TB is an ordinary write level. The first nonvolatile memory cell TC is at an erasure level. FIG. 9C shows a replacement state in which data is written to the target first nonvolatile memory cell TC after the step S13. The threshold voltage Vt of the first nonvolatile memory cell TC is the ordinary write level. The second nonvolatile memory cell TB is at the erasure level.

According to the present invention, nonvolatile memory cells (TC and TB) of two bits are used for one-bit replacement data, and complementary data is allocated to the nonvolatile memory cells of two bits, respectively. In the read operation, one sense amplifier complementarily reads data from the nonvolatile memory cells (TC and TB) of two bits to which the respective complementary data is allocated. Namely, the replacement data of the nonvolatile memory cells (TC and TB) can be promptly and accurately read.

Further, as shown in FIG. 4, three states are set to the threshold voltage, the write data is set to about the highest threshold voltage Vt settable for the nonvolatile memory cells, the intermediate write level is set to about the intermediate level between the erasure state level and the write level, whereby a very wide margin can be secured between the nonvolatile memory cells TC and TB. It is thereby possible to eliminate write error and read error. Data can be read at higher rate, accordingly.

Since the data write operation and read operation performed by such a nonvolatile semiconductor memory are the same as those according to the first embodiment, they will not be described herein.

It is apparent that the present invention is not limited to the above embodiment, that may be modified and changed without departing form the scope and spirit of the invention.

What is claimed is:

1. A nonvolatile semiconductor memory comprising:
a memory cell array which includes a plurality of main cell arrays and a plurality of redundancy cell arrays; and
a replacement data cell array which stores a replacement data indicating a replacement of one of said plurality of main cell arrays by one of said plurality of redundancy cell arrays,
wherein said replacement data cell array includes:
a plurality of first storage sections, each of which corresponds to one of said plurality of redundancy cell arrays and stores a replacement confirmation data indicating whether or not said corresponding one of the plurality of redundancy cell arrays replaces one of said plurality of main cell arrays, by nonvolatile memory cells of two bits, and
a plurality of second storage sections, each of which corresponds to one of said plurality of redundancy cell arrays and stores an address data indicating an address for one of said plurality of main cell arrays which is replaced by said corresponding one of the plurality of redundancy cell arrays.

2. The nonvolatile semiconductor memory according to claim 1, wherein said replacement data cell array includes a first sense amplifier which outputs a comparison data indicating a comparison result between two data from said nonvolatile memory cells of two bits of each of said plurality of first storage sections.

3. The nonvolatile semiconductor memory according to claim 2, wherein two nonvolatile memory cells are allocated for a one-bit data in said plurality of second storage sections,
each of said plurality of second storage sections includes a plurality of nonvolatile memory cells which store said address data,
said replacement data cell array includes a plurality of second sense amplifiers, each of which outputs a comparison data indicating a comparison result between two data from said allocated two nonvolatile memory cells included in one of said plurality of second storage sections, and
a data set of said comparison data outputted by said plurality of second sense amplifiers indicates said address data.

4. The nonvolatile semiconductor memory according to claim 3, wherein one of said allocated two nonvolatile memory cells stores a data different from a data stored in another of said allocated two nonvolatile memory cells based on said address data.

5. The nonvolatile semiconductor memory according to claim 4, wherein said one of said allocated two nonvolatile memory cells has one of a first threshold voltage and a second threshold voltage based on said address data,
said another of said allocated two nonvolatile memory cells has a third threshold voltage between said first threshold voltage and said second threshold voltage regardless of said address data,
said first threshold voltage is a threshold voltage when a data is not written in a nonvolatile memory cell, and
said second threshold voltage is a threshold voltage when a data is written in a nonvolatile memory cell.

6. The nonvolatile semiconductor memory according to claim 5, wherein a threshold voltage of said one of the allocated two nonvolatile memory cells of each of said plurality of second storage sections is set to said third threshold voltage, and
when said corresponding one redundancy cell array replaces said one main cell array, a threshold voltage of said another of the allocated two nonvolatile memory cells, of one of said plurality of second storage sections which corresponds to said corresponding one redundancy cell array, is set to said second threshold voltage.

7. The nonvolatile semiconductor memory according to claim 1, wherein each of said plurality of first storage sections includes a first nonvolatile memory cell and a second nonvolatile memory cell as said nonvolatile memory cells of two bits.

8. The nonvolatile semiconductor memory according to claim 7, wherein said first nonvolatile memory cell stores a data different from a data stored in said second nonvolatile memory cell based on whether or not said corresponding one redundancy cell array replaces said one main cell array.

9. The nonvolatile semiconductor memory according to claim 8, wherein said first nonvolatile memory cell has one of a first threshold voltage and a second threshold voltage based on whether or not said corresponding one redundancy cell array replaces said one main cell array,
said second nonvolatile memory cell has a third threshold voltage between said first threshold voltage and said second threshold voltage regardless of whether or not said corresponding one redundancy cell array replaces said one main cell array,
said first threshold voltage is a threshold voltage when a data is not written in a nonvolatile memory cell, and
said second threshold voltage is a threshold voltage when a data is written in a nonvolatile memory cell.

10. The nonvolatile semiconductor memory according to claim 9, wherein a threshold voltage of said second nonvolatile memory cell of each of said plurality of first storage sections is set to said third threshold voltage, and
when said corresponding one redundancy cell array replaces said one main cell array, a threshold voltage of said first nonvolatile memory cell, of one of said plurality of first storage sections which corresponds to said corresponding one redundancy cell array, is set to said second threshold voltage.

11. The nonvolatile semiconductor memory according to claim 1, wherein each of said plurality of first storage sections and said plurality of second storage sections includes:
first and second cells;
a constant current circuit;
a sense amplifier which determines an output based on two input data from said first and second cells;
a write circuit which supplies data to said first and second cells, respectively;
a first selector which is provided between said sense amplifier and said first and second cells;
a second selector which is provided between said sense amplifier and said constant current circuit; and
a third selector which is provided between said write circuit and said first and second cells.

12. The nonvolatile semiconductor memory according to claim 11, wherein said first selector selects one of connecting one of said first and second cells with said sense amplifier and connecting both of said first and second cells with said sense amplifier,
said second selector selects one of connecting said constant current circuit with one of two inputs of said sense amplifier and connecting said constant current circuit with nothing, and
said third selector selects one of connecting said write circuit with one of said first and second cells and connecting said write circuit with nothing.

13. The nonvolatile semiconductor memory according to claim 12, wherein said constant current circuit includes a nonvolatile memory cell.

14. The nonvolatile semiconductor memory according to claim 1, wherein each of said redundancy cell arrays corresponds to one of said first storage sections and one of said second storage sections of said replacement data cell array.

15. The nonvolatile semiconductor memory according to claim 1, wherein complementary one-bit replacement data is stored in said nonvolatile memory cells of two bits, and wherein said nonvolatile memory cells have multi-states, such that the replacement data is rewritable without performing an erasure operation.

16. A method for setting replacement information in a nonvolatile semiconductor memory, wherein said nonvolatile semiconductor memory includes: a memory cell array which includes a plurality of main cell arrays and a plurality of redundancy cell arrays, and a replacement data cell array which stores a replacement data indicating a replacement of one of said plurality of main cell arrays by one of said plurality of redundancy cell arrays, wherein said replacement data cell array includes: a plurality of first storage sections, each of which corresponds to one of said plurality of redundancy cell arrays and stores a replacement confirmation data indicating whether or not said corresponding one of the plurality of redundancy cell arrays replaces one of said plurality of main cell arrays, by nonvolatile memory cells of two bits, a plurality of second storage sections, each of which corresponds to one of said plurality of redundancy cell arrays and stores an address data indicating an address for one of said plurality of main cell arrays which is replaced by said corresponding one of the plurality of redundancy cell arrays, and a first sense amplifier which outputs a comparison data indicating a comparison result between two data from said nonvolatile memory cells of two bits of each of said plurality of first storage sections, wherein said each of said plurality of first storage sections includes a first nonvolatile memory cell and a second nonvolatile memory cell as said nonvolatile memory cells of two bits, said method comprising:

(a) setting a threshold voltage of said second nonvolatile memory cell of each of said plurality of first storage sections from an initial voltage to said second threshold voltage; and (b) setting a threshold voltage of said first nonvolatile memory cell of one of said plurality of first storage sections corresponds to said corresponding one redundancy cell array from said initial voltage to said first threshold voltage, when said corresponding one redundancy cell array replaces said one main cell array, wherein said first threshold voltage is a threshold voltage when a data is written in a nonvolatile memory cell, and said second threshold voltage is a threshold voltage between said initial voltage and said first threshold voltage.

17. The method for setting replacement information in a nonvolatile semiconductor memory according to claim 16, wherein two nonvolatile memory cells are allocated for a one-bit data in said plurality of second storage sections, each of said plurality of second storage sections includes a plurality of nonvolatile memory cells which store said address data, said method further comprising:

(c) setting a threshold voltage of said one of the allocated two nonvolatile memory cells of each of said plurality of second storage sections from said initial voltage to said second threshold voltage, and (d) setting a threshold voltage of said another of the allocated two nonvolatile memory cells of one of said plurality of second storage sections corresponds to said corresponding one redundancy cell array from said initial voltage to said first threshold voltage, when said corresponding one redundancy cell array replaces said one main cell array.

18. A nonvolatile semiconductor memory comprising:

a main cell array including memory cells;

a redundancy cell array including memory cells to replace a defective cell of said main cell array; and a storage section storing an information of said replacement, wherein said storage section stores said information by using two memory cells, and wherein each bit of said memory cells in said storage section has at least three states as a threshold voltage.

19. The nonvolatile semiconductor memory according to claim 18, wherein the replacement information includes one-bit and is stored in the storage section memory cells having two bits, said memory cells of two bits having complementary threshold voltages or complementary data of the replacement.

20. A nonvolatile semiconductor memory according to claim 18, wherein said memory cells in said storage section comprise at least three states as their threshold voltage such that a non-replacement state is set to a replacement state without requiring an erasure operation.

* * * * *